(12) United States Patent
Beer

(10) Patent No.: US 6,636,447 B2
(45) Date of Patent: Oct. 21, 2003

(54) MEMORY MODULE, METHOD FOR ACTIVATING A MEMORY CELL, AND METHOD FOR REPAIRING A DEFECTIVE MEMORY CELL

(75) Inventor: Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/159,858

(22) Filed: May 31, 2002

(65) Prior Publication Data

US 2002/0181302 A1 Dec. 5, 2002

(30) Foreign Application Priority Data

May 31, 2001 (DE) .......................................... 101 26 599

(51) Int. Cl.[7] ................................................. G11C 7/00
(52) U.S. Cl. ..................................... 365/200; 365/225.7
(58) Field of Search ................................. 365/200, 201, 365/225.7, 230.06, 185.09

(56) References Cited

U.S. PATENT DOCUMENTS

| 4,757,474 A | * | 7/1988 | Fukushi et al. ............. 365/200 |
| 5,586,075 A | * | 12/1996 | Miwa .......................... 365/200 |
| 6,392,938 B1 | * | 5/2002 | Choi et al. ................... 365/200 |
| 6,535,436 B2 | * | 3/2003 | Brady ......................... 365/200 |

OTHER PUBLICATIONS

Lizy Kurian John: "VaWiRAM: A variable Width Random Access Memory Module", *9th International Conference on VLSI Design*, Jan. 1996, pp. 219–224.

* cited by examiner

Primary Examiner—Tan T. Nguyen
(74) Attorney, Agent, or Firm—Laurence A. Greenberg; Werner H. Stemer; Ralph E. Locher

(57) ABSTRACT

In the memory module, depending on the configuration chosen, the number of redundant memory cells which is assigned to a defective address is also adapted to the configuration chosen. It is thus possible to repair more defective addresses for a given number of redundant memory cells.

10 Claims, 4 Drawing Sheets

MEMORY MODULE, METHOD FOR ACTIVATING A MEMORY CELL, AND METHOD FOR REPAIRING A DEFECTIVE MEMORY CELL

BACKGROUND OF THE INVENTION

Field of the Invention

The invention relates to a memory module having memory cells and a predetermined number of redundant memory cells which are used for repairing defective memory cells. A first address circuit is provided, which activates a predeterminable number of memory cells via address lines in dependence on a predetermined address. A second address circuit is provided, which is connected to the redundant memory cells via second address lines. The second address circuit, in the event that a defect address of at least one defective memory cell is supplied, activates the redundant memory cells assigned to the defect address. A selection circuit is provided, which is connected to the first address circuit. The selection circuit defines the predeterminable number of memory cells which are activated by the first address circuit in the event of an address being supplied.

The invention also pertains to a method for activating memory cells, in particular for writing and/or reading data to and/or from memory cells of a memory module. A defined number of memory cells are activated via an address, redundant memory cells are provided for defective memory cells and are activated after a repair instead of the defective memory cells with the address of the defective memory cells. The number of memory cells which can be activated under an address is defined by a check of a number datum.

Furthermore, the invention pertains to a method for repairing defective memory cells of a memory module by way of redundant memory cells. A predeterminable number of memory cells are able to be activated via an address, in particular data being written to the memory cells or read therefrom. The predeterminable number is predetermined in a manner dependent on a number datum, the memory cells are checked for correct functioning, and memory cells that have been identified as defective are replaced by redundant memory cells, and the redundant memory cells are activated when an address of defective memory cells is present.

Memory cells are used in various types of memory modules, such as, for instance, in a DRAM memory. DRAM memories have a multiplicity of memory cells which are fabricated by means of a multiplicity of complex semiconductor processes. Despite very great efforts, it is not possible to fabricate all the memory cells of a memory module without any defects. To ensure, however, that the entire memory module is not defective on account of individual defective memory cells, additional, so-called redundant memory cells are arranged on the memory module, which are used during a repair of defective memory cells. By way of example, if it is ascertained at the end of the fabrication process, when checking the memory cells, that a memory cell is defective, then the address of the defective memory cell is diverted to a redundant memory cell in an address decoder. During later use of the memory module, it is not apparent that, instead of the defective memory cell, the redundant memory cell is actually being driven in the event of the addressing of the defective memory cell.

It has been found that repairing individual memory cells is not economic. Therefore, memory cells of an entire word line or memory cells of an entire bit line are replaced by correspondingly redundant memory cells of an entire word line or of an entire bit line. So-called laser fuses, which represent fuses, are used for programming the new address. By blowing the fuse, a defined electrical state is set at the input of the fuse. The address of a defective memory cell is defined, for example, by the arrangement of a plurality of electrical fuses and the programming thereof. If the defective memory cell is then connected to an address decoder, the address decoder recognizes from the comparison with the fuses that this address is an address of a defective memory cell. The defective address is thereupon replaced by a stored replacement address of a redundant memory cell and the redundant memory cell is activated instead of the defective memory cell.

Furthermore, it is known to provide electrical fuses via which additional SRAM memory cells are used as redundant memory cells. The SRAM memory cells can be activated via the electrical fuses even in the already constructed memory module.

Memory modules have memory arrays which can be switched into different address configurations via corresponding programming. By way of example, 4, 8 or 16 memory cells can be assigned to a single address by a corresponding selection. Consequently, the number of memory cells that are driven when an individual address is prescribed depends on the type of programming of the memory module. To date, when repairing a memory cell of an address, the maximum possible number of redundant memory cells has always been addressed under the address of the defective memory cell.

SUMMARY OF THE INVENTION

It is accordingly an object of the invention to provide a memory module, a method for activating memory cells, and a method for repairing defective memory cells, which overcomes the above-mentioned disadvantages of the heretofore-known devices and methods of this general type and wherein, with the number of redundant memory cells remaining the same, a larger number of defective memory cells can be repaired.

With the foregoing and other objects in view there is provided, in accordance with the invention, a memory module, comprising:

a plurality of memory cells and a predetermined number of redundant memory cells for repairing defective memory cells;

a first address circuit configured for activating a predeterminable number of memory cells via address lines in dependence on a predetermined address;

a second address circuit connected to the redundant memory cells via second address lines;

the second address circuit, upon receiving a defect address of at least one defective memory cell, activating redundant memory cells assigned to the defect address; and a selection circuit connected to the first address circuit and to the second address circuit, the selection circuit defining the predeterminable number of memory cells to be activated by the first address circuit in event of an address being supplied, and the selection circuit prescribing for the second address circuit how many redundant memory cells are to be activated under a defect address.

With the above and other objects in view there is also provided, in accordance with the invention, a method of activating memory cells, in particular for writing data to and for reading data from a memory module. The method comprises:

activating a defined number of memory cells via an address;

providing redundant memory cells for defective memory cells and, after a repair, activating the redundant memory cells instead of the defective memory cells with the address of the defective memory cells;

checking a number datum to thereby define the number of memory cells that can be activated under an address, and wherein, when redundant memory cells are activated, checking the number datum and activating a predeterminable number of redundant memory cells in dependence on the number datum.

With the above and other objects in view there is further provided, in accordance with the invention, a method for repairing defective memory cells of a memory module, which comprises:

providing a memory module with memory cells and redundant memory cells, wherein a predeterminable number of memory cells are activatable via an address, and the predeterminable number is predetermined in dependence on a number datum;

checking the memory cells for correct functioning;

identifying defective memory cells and replacing the defective memory cells by redundant memory cells, the redundant memory cells being activated when an address of defective memory cells is present; and defining a number of redundant memory cells that are addressed for an address instead of the defective memory cells in accordance with the number datum.

One advantage of the invention is that, during a repair of defective memory cells, account is taken of the data depth to which driving is effected, i.e. how many memory cells are driven via an individual address, and the corresponding data depth is also used during the repair by redundant memory cells. In this way, only as many redundant memory cells as are necessary are used during the repair of a defective address. The limited number of redundant memory cells is thus used more effectively. Consequently, compared with known memory modules and known methods, given a data depth of the memory module which is smaller than the maximum data depth, more defective memory cells can be replaced.

In an advantageous refinement of the invention, a selection circuit used to define the data depth of the memory module is designed in the form of a programmable latch memory. The use of a latch memory affords the advantage of a known and mature technology.

Laser fuses or electrically programmable fuses are preferably used for the realization of the selection circuit. Consequently, the selection circuit can also be constructed by the use of a mature technology.

Furthermore, in a preferred embodiment of the invention, an output memory of the memory module is connected to the selection circuit and the selection circuit defines the data width of the output memory. This ensures that even on the output side of the memory module, only the number of data which correspond to the memory depth set are output.

The redundant memory cells are preferably designed in the form of SRAM memory cells.

One advantage of the method for activating memory cells, as outlined above, is that during the activation of memory cells, during which redundant memory cells are driven under an address of defective memory cells, a number datum is checked before the activation of the redundant memory cells. The number datum specifies how many memory cells can be activated under an address of the memory module.

The number of redundant memory cells which is predetermined by the number datum is activated in a manner dependent on the number datum. It is ensured in this way that, during the activation of the memory cells, the redundant memory cells are activated with the same data depth as the defective memory cells provided under the address.

The method for repairing defective memory cells as outlined above has the advantage that the number of redundant memory cells which is addressed under an address instead of the defective memory cells is developed in a manner dependent on the number datum. Thus, during the repair, too, the number of redundant memory cells which are assigned to an address is only as many as the number of defective memory cells which can be activated under the address. Consequently, the limited number of redundant memory cells is used effectively.

Other features which are considered as characteristic for the invention are set forth in the appended claims.

Although the invention is illustrated and described herein as embodied in a memory module, method for activating a memory cell and method for repairing a defective memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
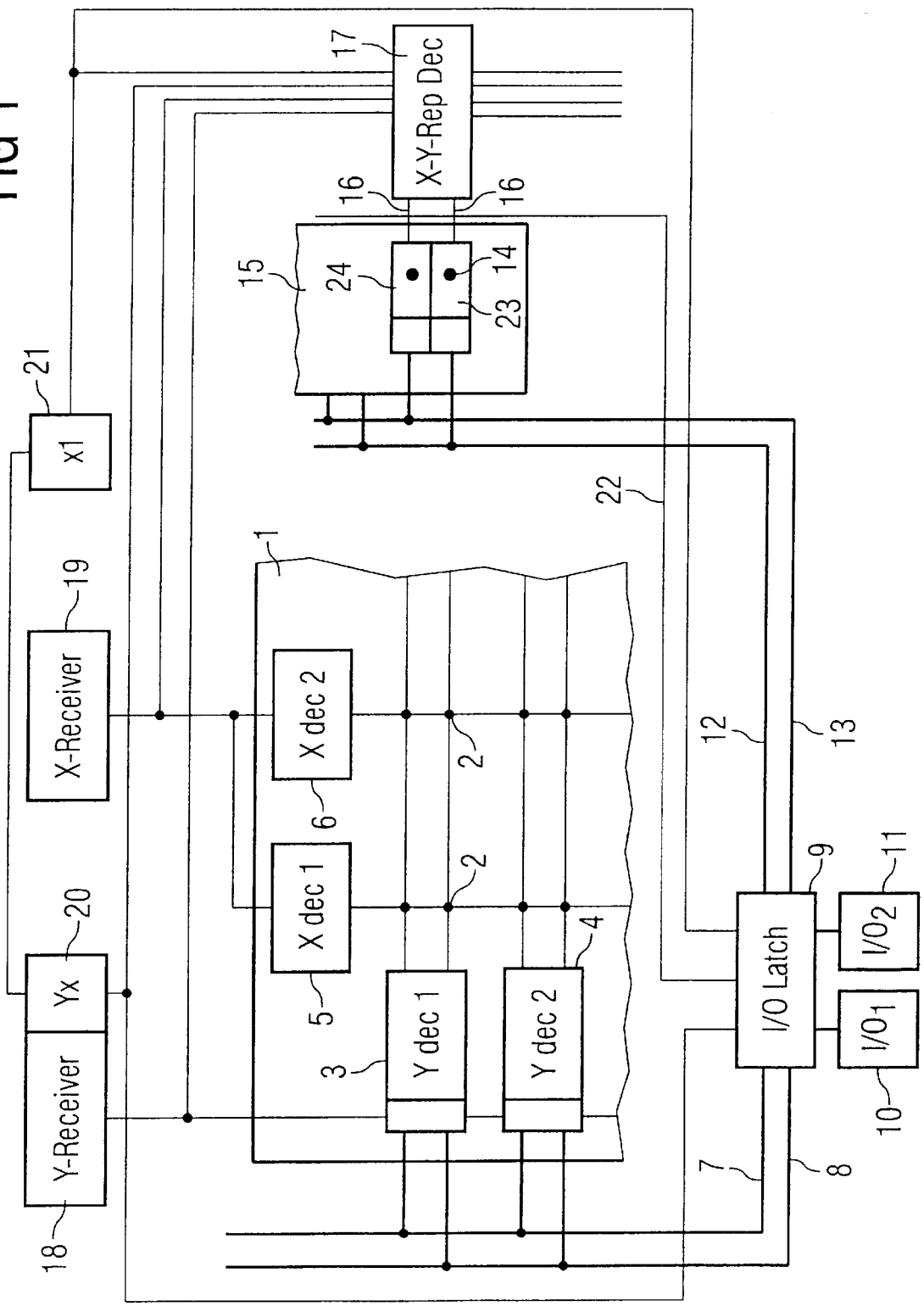
FIG. 1 is a schematic block diagram of a circuit configuration of a DRAM memory module.

Referring now to the figures of the drawing in detail and first, particularly, to FIG. 1 thereof, there are shown details from a circuit configuration of a semiconductor memory. The semiconductor memory has a memory array 1 comprising a multiplicity of memory cells 2. The memory cells 2 are arranged in rows and columns, a row of memory cells in each case being connected to a first address decoder 3 via a row line. The first address decoder 3 has two row lines which are each connected to a row of memory cells 2. A second address decoder 4 is provided, which likewise has two row lines, each row line being connected to a row of memory cells 2.

Furthermore, third and fourth address decoders 5, 6 are provided, the third and fourth address decoders 5, 6 each having a single column line, which are connected to a multiplicity of memory cells arranged in a column. In this way, each memory cell 2 is connected to a row line and a column line. The first and second address decoders 3, 4 each have a first and a second output line 7, 8, which are connected to an output interface 9. The output interface 9 is connected to a first and a second input/output memory 10, 11.

The output interface 9 is furthermore connected to redundant memory cells 14 via a third and fourth output line 12, 13. The redundant memory cells 14 are arranged in a replacement memory array 15. Each redundant memory cell 14 is connected to a fifth address decoder 17 via a drive line 16. The memory array 1 and the replacement memory array 15 are only partially illustrated. The replacement memory array 15 has a first and second memory area, which differ by a further Y address Yx. Consequently, two replacement memory cells 14 are always addressed via the prescription of a Y address. If the second Y address Yx is also taken into account, then the two memory areas are differentiated and only one replacement memory cell 14 is ever addressed.

A first receiver 18 and a second receiver 19 are provided, the first receiver 18 being provided for receiving a Y address and the second receiver 19 being provided for receiving an X address of a memory cell. The first receiver 18 is additionally connected to an evaluation circuit 20, which is connected to a setting circuit 21 via an input line. Moreover, the evaluation circuit 20 is connected to the output interface 9 via an output line. Furthermore, the evaluation circuit 20 is connected by its output to a fifth address decoder 17. The second receiver 19 is connected via an output line to the third and fourth address decoders 5, 6 and to the fifth address decoder 17.

Moreover, the setting circuit 21 is connected via a second output line to the fifth address decoder 17 and to the output interface 9. Moreover, the fifth address decoder 17 is connected to the output interface 9 via a drive line 22.

The arrangement of FIG. 1 functions as follows: in order to read or write a datum from or to a memory cell 2, the memory cell 2 is addressed via defined address and is driven via a first or second address decoder 3, 4 and a third or fourth address decoder 5, 6. The address of the memory cell is divided into a Y address and an X address. The Y address is fed to the first receiver 18 by an address circuit, which first receiver forwards the Y address to the first and second address decoders 3, 4. By way of example, if the Y address of the first address decoder 3 is output by the first receiver 18, then the first address decoder 3 identifies its own address and applies a predetermined signal to its drive lines. As a result, the predetermined signal is applied to all the memory cells 2 which are connected to the drive lines of the first address decoder 3.

In parallel with this, the second receiver 19 receives the X address of the memory cell 2 to be driven and forwards this to the third and fourth address decoders 5, 6. By way of example, if the second receiver 19 outputs the X address of the third address decoder 5, then the third address decoder 5 identifies its own address and outputs a predetermined signal via its output line. As a result, all the memory cells 2 which are connected to the output line of the third address decoder 5, on the column line, are supplied with the predetermined signal. A memory cell 2 has a selection transistor and a storage capacitor. The selection transistor is connected by a control terminal to a column line of the third or fourth address decoder 5, 6. If the third address decoder 5 outputs a drive signal via its column line, then all the selection transistors of the memory cells connected to the column line are turned on. In this case, the charge stored in the capacitor is output onto the row lines.

In the exemplary embodiment described, by way of example, the memory cells connected to the third address decoder 5 are conductively connected to the row lines which are connected to the first or second address decoder 3, 4. If, as in this exemplary embodiment, the first address decoder 3 simultaneously receives its own address, then the signals of the row lines are amplified and output onto the first and second output lines 7, 8. The datum stored in the memory cells is thus transmitted to the output interface 9. The output interface 9 subsequently outputs the two data via the first and second input/output memories 10, 11.

If two data are to be written to two memory cells, then the two data are transmitted via the first and second input/output memories 10, 11 to the output interface 9, which in turn forwards the two data to the first and second output lines 7, 8. Depending on which Y address is output by the first receiver 18, the datum of the first and the second output lines 7, 8 is received by the selected first or second address decoder 3, 4, amplified and output via its drive lines, which represent the row lines. The output signal of the third or fourth address decoder 5, 6 defines the memory cells 2 to which the two data are written. Consequently, the selection of the driven memory cells is defined by the Y and X addresses which are output by the first and second receivers 18, 19. The memory module illustrated in FIG. 1 is designed in an x2 configuration. This means that in each case two data can be simultaneously written to two memory cells or read from two memory cells. The configuration x2 is chosen for reasons of clarity, since memory modules are usually designed with a configuration x4, x8 or x16.

In the x2 configuration, the fifth address decoder 17 chooses only a Y address and the X address. In this way, a replacement memory cell 14 from the first memory area 23 and a replacement memory cell 14 from the second memory area 24 of the replacement memory array are always addressed. After the fabrication of a memory module in accordance with FIG. 1, the functioning of the memory cells 2 of the memory module is checked. If it is then recognized that a memory cell 2 is defective, then a fifth address decoder 17 is programmed in such a way that the fifth address decoder 17, upon receiving an address of two defective memory cells 2, outputs a read-out signal to the replacement memory cells 14 connected to the fifth address decoder 17. By way of example, the memory cells 2 arranged in the top left area of the memory array 1 have the address X1, Y1. If one of the two memory cells 2 is identified as defective during a check, then the address Y1, X1 is stored as a defect address in the fifth address decoder 17 and two replacement memory cells 14 are assigned to the defect address. If the address X1, Y1 is then output by the first and second receivers 18, 19, the fifth address decoder 17 receives the address X1, Y1 and immediately recognizes that the two redundant memory cells 14 assigned to the address Y1, X1 must be driven. Furthermore, the fifth address decoder 17 passes an indication signal via a drive line 22 to the output interface 9, which thereupon outputs only data supplied by the third and fourth output lines 12, 13. At the same time, the fifth address decoder 17 drives the two redundant memory cells 14 via the drive line 16. Consequently, the data stored in the redundant memory cells 14 are output to the output interface 9 via the third and fourth output lines 12, 13.

In the case of the configuration x1, the fifth address decoder 17 receives the signal that a second Y address Y2 is to be taken into account during the selection. The second Y address differentiates the first and second memory areas 23, 24, so that an individual redundant memory cell 14 can be driven by the fifth address decoder. To that end, the addresses of the defective memory cells 2 with the Y and X addresses and the second Y address are correspondingly programmed in the fifth address decoder 17 for example by means of laser fuses or electrical fuses.

If the memory module illustrated in FIG. 1 is to be operated in the x1 mode, then a corresponding item of information is written to the setting circuit 21. If the setting circuit 21 has the information of an x1 mode, then the setting circuit 21 passes a setting signal to the evaluation circuit 20 and the fifth address decoder 17. If the first receiver 18 detects the x1 configuration, then the Y address is augmented by a second Y address Y2. Upon receiving the setting signal, the evaluation circuit 20 passes a signal to the first receiver 18. Upon receiving the signal from the evaluation circuit 20, the receiver 18 outputs, in addition to the first Y address and the X address, a second Y address Y2 during the prescription of an address. Moreover, the setting circuit 21 transfers the information of the x1 mode to the output interface 9. Upon receiving the signal of an x1 mode, the output interface 9 switches off the second output memory 11, so that, in the x1 mode, a datum is output or read in only via the first output memory 10.

The prescription of the x1 mode by the setting circuit 21 means that the memory cells 2 can be addressed individually. The first and second Y addresses output by the first receiver 18 make it possible for the first and second address decoders 3, 4 to connect only an individual row line to the first or second output line 7, 8.

At the same time, the fifth address decoders 17 are supplied with the information that the memory module is operated in the x1 mode. Consequently, a first and a second Y address are also taken into account by the fifth address decoders 17. Consequently, the redundant memory cells 14 are driven individually by the fifth address decoder 17.

If it is then recognized during the checking of the functionality of the memory cells that only an individual memory cell 2 is defective in the x1 mode, then the address of the redundant memory cell to be driven is programmed in the fifth address decoder 17 with a first and second Y address and an X address.

The memory module described has the advantage that, depending on the choice of configuration, it is also possible to set the number of redundant memory cells 14 to be driven in the case of a given address.

In the exemplary embodiment of FIG. 1 described, two memory cells are connected to the first or second output lines 7, 8 in the x2 mode by prescription of a single Y address. Consequently, two memory cells are addressed via an individual Y address. At the same time, the fifth address decoder 17 receives via the setting means 21 the information that an x2 mode is present, so that the fifth address decoder 17 only evaluates the first Y address and simultaneously drives two redundant memory cells if the address of two memory cells 2 to be repaired is involved.

Figure 2:
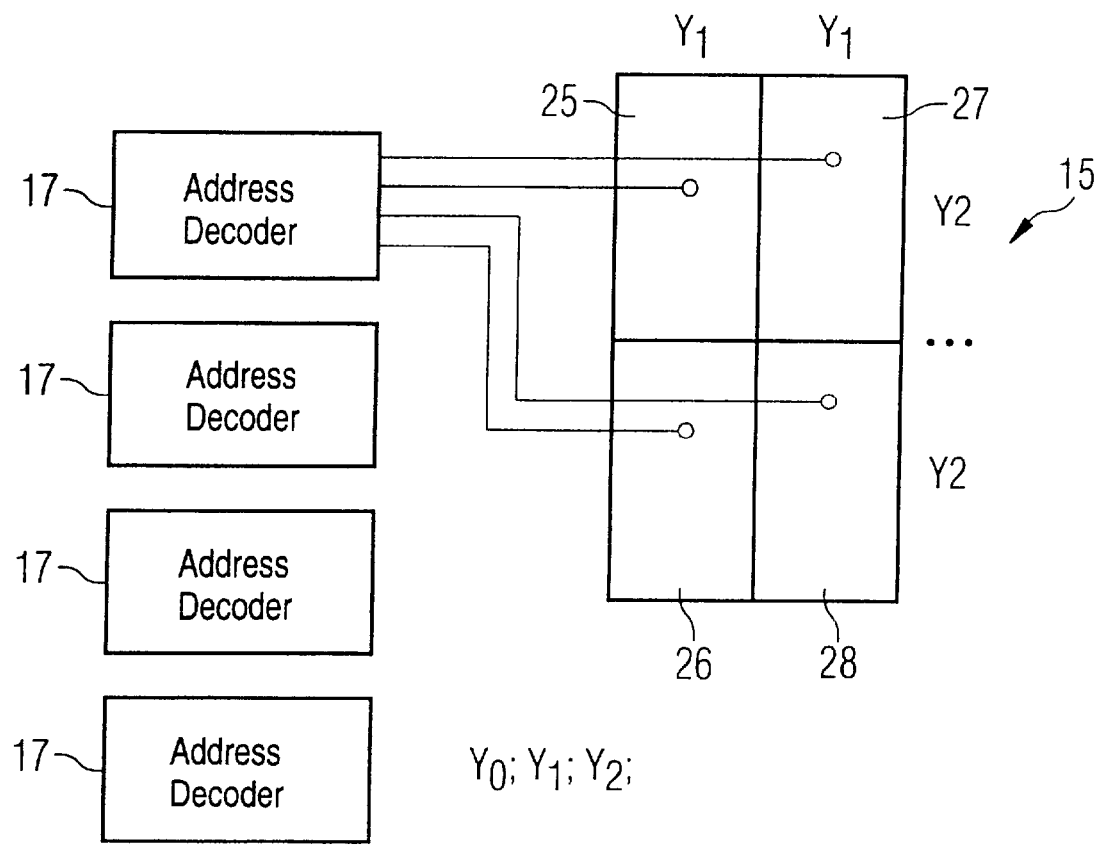
FIG. 2 is a block diagram showing the configuration of a fifth address decoder with a replacement memory array.

FIG. 2 diagrammatically shows the arrangement of four fifth address decoders 17 which are provided in the design of a memory module in the x16 mode. The four fifth address decoders 17 are constructed identically and are connected via address lines to redundant memory cells of four memory arrays 25, 26, 27, 28. The four memory arrays 25, 26, 27, 28 form a replacement memory array 15. Each memory array has a multiplicity of redundant memory cells 14 which can be addressed within the memory array via an X, Y address. Consequently, a redundant memory cell 14 having the same X, Y address is provided in each memory array 25, 26, 27, 28. For reasons of clarity, address lines are diagrammatically depicted only for the topmost fifth address decoder 17, but each address decoder 17 is connected via an address line to each redundant memory cell of the first, second, third and fourth memory arrays 25, 26, 27, 28. The four fifth address decoders 17 are connected to the setting circuit 21 in accordance with the embodiment of FIG. 1. Moreover, the fifth address decoders 17 are connected to the output interface 9 via 16 output lines 12, 13.

If the memory module of the x16 configuration is operated, sixteen memory cells 2 in the memory array 1 are also addressed under an X, Y address. If it is then recognized during the checking of the memory module that an address of the memory array 1 has a defective memory cell 2, the address is programmed into the four fifth address decoders 17. The programming is preferably effected by means of laser fuses or electrical fuses. At the same time, the setting circuit 21 is switched into the x16 mode, which in turn passes on the information that an x16 mode is present to the four fifth address decoders 17. As a consequence of this, during the driving of the memory cells, the fifth address decoders 17 take into account only the X, Y address and not a second and a third Y address. A memory cell is uniquely identified in the four memory arrays 25, 26, 27, 28 by the X, Y address, a second Y address and a third Y address. The second Y address indicates whether the memory cell is arranged in the left-hand area, i.e. in the first or second memory array 25, 26, or in the third or fourth memory array 27, 28. The third Y address indicates whether the redundant memory cell 14 is arranged in the upper or lower area of the replacement memory array 15 i.e. in the first or third memory array 25, 27 or in the second or fourth memory array 25, 28. In the x16 mode, only the X, Y address is stored as redundant address in the fifth address decoder 17. At the same time, only the X, Y address is forwarded to the fifth address decoders 17 by the first receiver 18.

If the memory module is programmed to an x8 configuration by means of a bonding option, then a second Y address is also programmed in besides the X, Y address. At the same time, in the x8 mode, the setting circuit 21 passes a corresponding signal to the evaluation circuit 20 and the fifth address decoder 17. In the x8 mode, the first receiver 18 also outputs a second Y address in addition to the X, Y address. Consequently, the two activated fifth address decoders 17, upon identification of a defective address, via the X, Y address and the second Y address, drive in each case two addresses with the same X, Y address in the first and second memory arrays 25, 26. Consequently, upon the prescription of a defective address by the first register 18, in each case only two redundant memory cells 14, i.e. a total of four memory cells 14, are driven by the two active fifth address decoders 17 by taking account of the X, Y address and the second Y address per defective address.

If the memory module is driven in the x4 operating mode, then the register 18 also outputs a third Y address in addition to the X, Y address and the second Y address. At the same time, the setting circuit 21 transmits to the fifth address decoder 17 the information that the memory module is operated in the x4 mode. The fifth address decoder 17 thus knows that the X, Y address, the second Y address and the third Y address are evaluated during the driving of the redundant memory cells 14. Consequently, the four fifth address decoders 17 upon the prescription of an address of four defective memory cells, in each case drive a redundant memory cell 14 in one of the four memory arrays 25, 26, 27, 28, so that four data bits can be driven under an address. During the driving of the redundant memory cells 14, the information stored in the redundant memory cell 14 is transmitted to the output interfaces 9 via corresponding third and fourth output lines 12, 13. The output interface 9 has first and second output memories 10, 11 in the x16 mode 16. If the memory module is operated in the x8 mode, then the output interface 9 receives the information from the setting circuit 21 that the memory module is operated in the x8 mode. After receiving this information, the output interface 9 switches off eight of the sixteen output memories 10, 11 and then also outputs data via the eight active output memories 10, 11.

In a corresponding manner, when the memory module is operated in the x4 mode, the output interface 9 switches off twelve of the sixteen output memories, so that data are output only via four active output memories 10, 11.

If the memory module is operated in the x16 mode, for example, then the first and second address decoders 3, 4, which represent a Y address decoder, in each case have 16 row lines, each row line being connected to a multiplicity of memory cells. At the same time, the output interface 9 also has 16 output memories, so that 16 data can be read in or out at the same time. Moreover, 32 output lines are also provided.

If an address is then identified as a defective address, four fifth address decoders 17 are programmed to this defect address. The consequence of this is that, upon prescription of the defect address, stored in the fifth address decoders 17, from the first receiver 18, the four fifth address decoders 17 conductively connect the sixteen redundant memory cells 14, connected to the four fifth address decoders 17, to the corresponding sixteen output lines.

The use of the setting circuit 21 enables an adapted configuration of the redundant memory cells 14 to the configuration chosen in the memory array 1.

Figure 3:
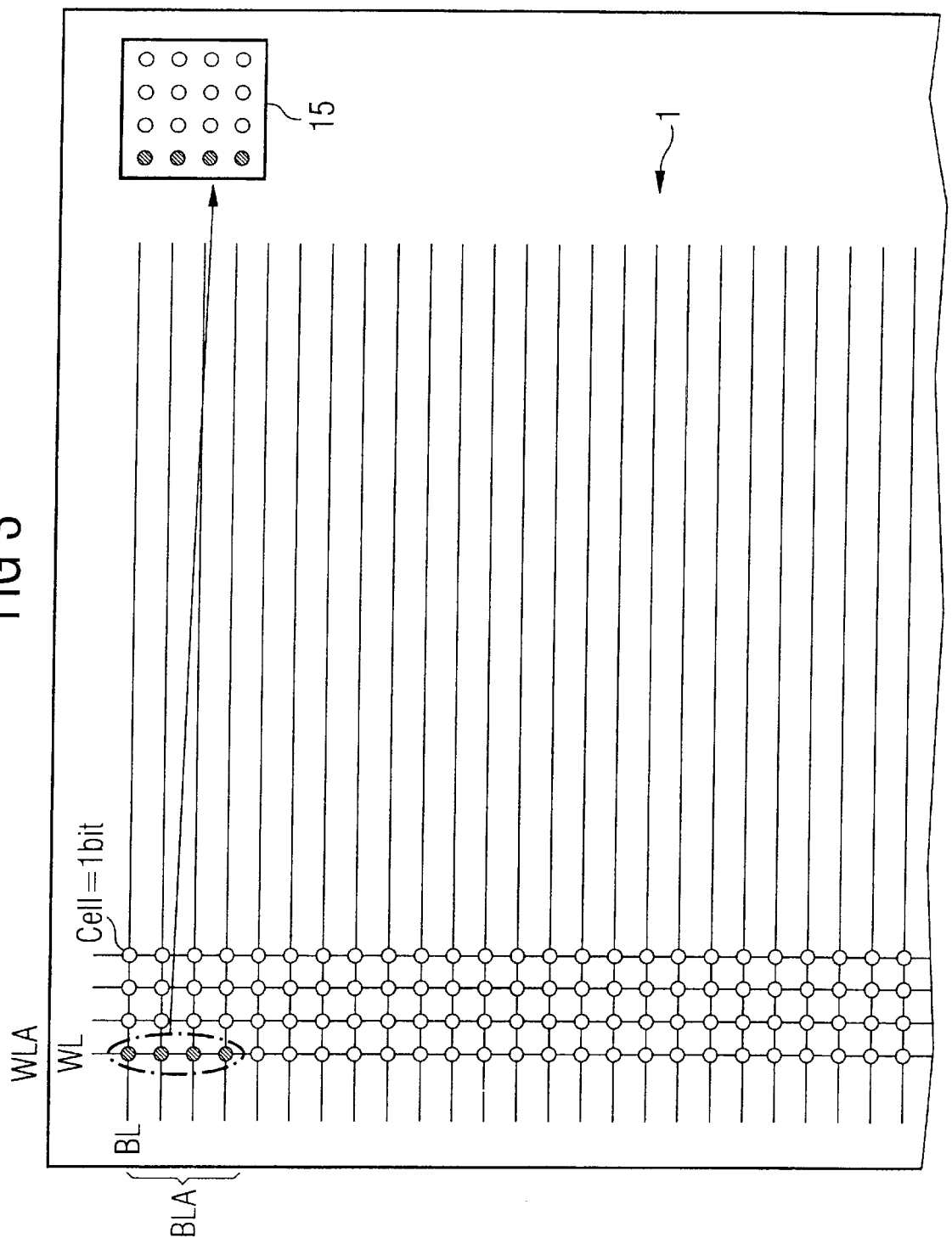
FIG. 3 is a diagram showing an assignment of an address to redundant memory cells.

FIG. 3 diagrammatically shows the arrangement of a memory array 1 and of a replacement memory array 15. The memory module illustrated in FIG. 3 is operated in the x4 mode, so that four memory cells 2 are simultaneously connected with an individual address. This is indicated in FIG. 3 in the form of a closed circle which encompasses four memory cells 2 which are connected via four bit lines to a, for example, first address decoder 3. The bit lines are indicated horizontally. Word lines which are each connected to a third or fourth address decoder 5, 6 are illustrated perpendicularly to the bit lines. In the configuration illustrated, a defective address is repaired by four redundant memory cells 14, which are depicted as dark circles in the replacement memory array 15.

Figure 4:
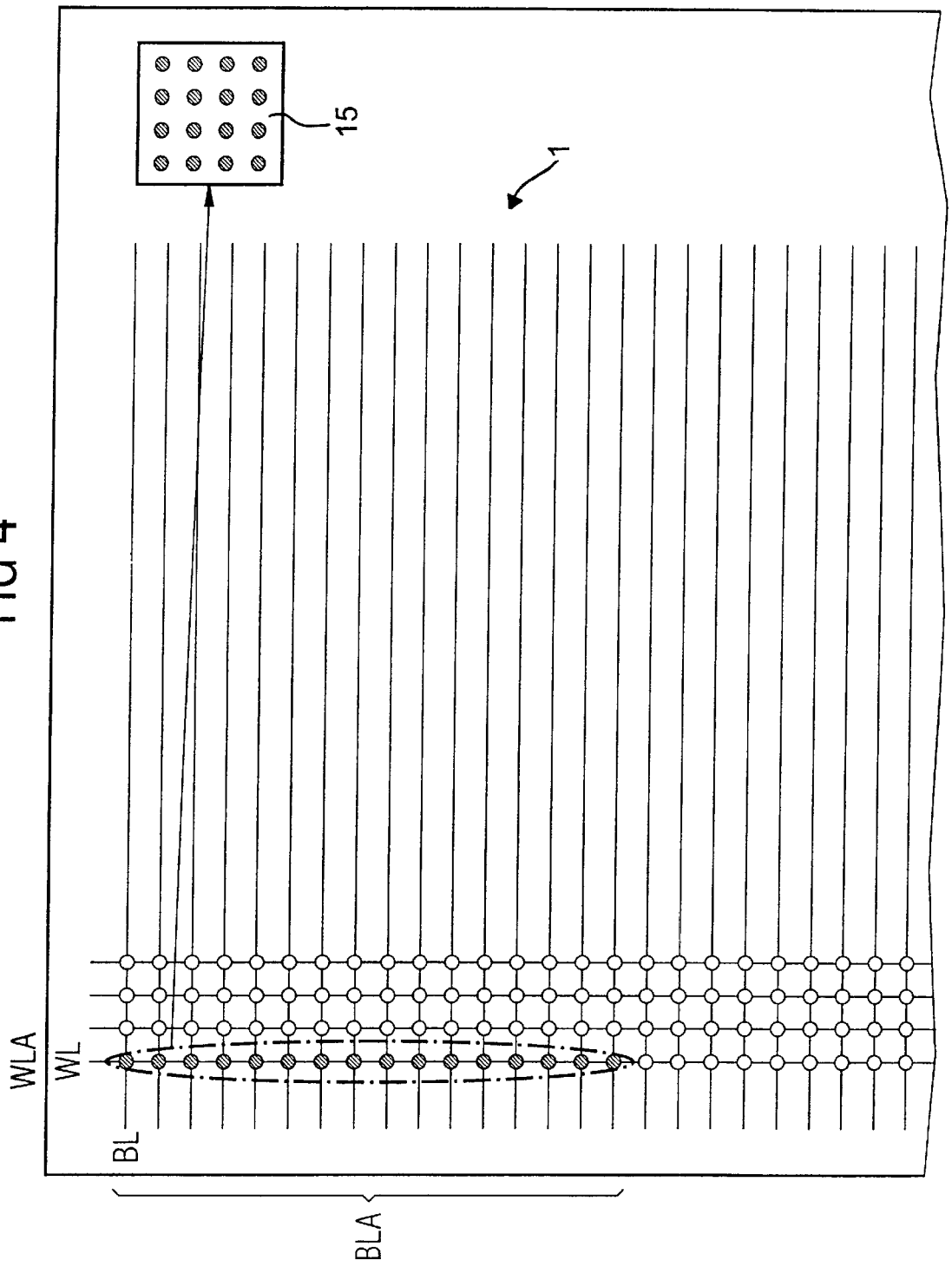
FIG. 4 is a similar diagram showing a second type of assignment of an address to redundant memory cells.

FIG. 4 diagrammatically shows a memory module with a memory array 1 and a replacement memory array 15. In the memory module illustrated in FIG. 4, 16 memory cells are simultaneously addressed via an individual address. The x16 configuration is illustrated diagrammatically in such a way that 16 memory cells 2 located on a word line are encompassed by a dash-dotted line and are shown dark in the illustration.

In the x16 configuration, a defective Y address is repaired by 16 redundant memory cells 14, which are illustrated in the replacement memory array 15. The 16 redundant memory cells 14 are illustrated in the form of dark circles in the replacement memory array 15.

The x16 configuration usually corresponds to a basic configuration of a memory module. In this case, 16 memory cells are addressed via an applied address. Consequently, 16 data items can simultaneously be written to the memory module or read therefrom per address. However, the configuration can be altered by means of a bonding option in such a way that fewer memory cells are simultaneously addressed via an individual address. By way of example, an x16 memory module can be reconfigured into an x8 or x4 memory module. In order that all the memory cells can be addressed, the number of data bits of the Y addresses is simultaneously increased by one or two bits.

Depending on the configuration of the memory module, the information of the setting circuit 21 is also altered, so that the redundant memory cells 14 which can be driven per address are adapted to the configuration chosen for the memory module. As a result, in the case of a configuration which is smaller than the maximum configuration, more addresses that have been identified as defective can be repaired via the existing number of redundant memory cells 14.

I claim:

1. A memory module, comprising:
   a plurality of memory cells and a predetermined number of redundant memory cells for repairing defective memory cells;
   a first address circuit configured for activating a predeterminable number of memory cells via address lines in dependence on a predetermined address;
   a second address circuit connected to said redundant memory cells via second address lines;
   said second address circuit, upon receiving a defect address of at least one defective memory cell, activating redundant memory cells assigned to the defect address; and
   a selection circuit connected to said first address circuit and to said second address circuit, said selection circuit defining the predeterminable number of memory cells to be activated by said first address circuit in event of an address being supplied, and said selection circuit prescribing for said second address circuit how many redundant memory cells are to be activated under a defect address.

2. The memory module according to claim 1, wherein said selection circuit is a programmable latch memory.

3. The memory module according to claim 2, wherein said selection circuit is programmable by programming fuses selected from the group consisting of laser fuses and electrical fuses.

4. The memory module according to claim 1, which further comprises an output memory having an adjustable data width; and wherein said selection circuit is connected to said output memory, and said selection circuit defines the data width of said output memory.

5. The memory module according to claim 1, wherein said redundant memory cells are SRAM memory cells.

6. The memory module according to claim 1, wherein said memory cells are DRAM memory cells.

7. A method of activating memory cells, which comprises:
   activating a defined number of memory cells via an address;
   providing redundant memory cells for defective memory cells and, after a repair, activating the redundant memory cells instead of the defective memory cells with the address of the defective memory cells;
   checking a number datum to thereby define the number of memory cells that can be activated under an address, and wherein, when redundant memory cells are activated, checking the number datum and activating a predeterminable number of redundant memory cells in dependence on the number datum.

8. The method according to claim 7, which comprises activating the memory cells and the redundant memory cells for one of writing data to and reading data from a memory module.

9. A method for repairing defective memory cells of a memory module, which comprises:
   providing a memory module with memory cells and redundant memory cells, wherein a predeterminable number of memory cells are activatable via an address, and the predeterminable number is predetermined in dependence on a number datum;

checking the memory cells for correct functioning;

identifying defective memory cells and replacing the defective memory cells by redundant memory cells, the redundant memory cells being activated when an address of defective memory cells is present; and defining a number of redundant memory cells that are addressed for an address instead of the defective memory cells in accordance with the number datum.

10. The method according to claim 9, which comprises addressing the memory cells for writing data to the memory cells and for reading data from the memory cells.

* * * * *